United States Patent
Smith

(10) Patent No.: US 9,605,346 B2
(45) Date of Patent: Mar. 28, 2017

(54) SYSTEMS AND METHODS FOR PRESSURE-BASED LIQUID FLOW CONTROL

(71) Applicant: LAM RESEARCH CORPORATION, Fremont, CA (US)

(72) Inventor: Colin F. Smith, Half Moon Bay, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 307 days.

(21) Appl. No.: 14/228,582

(22) Filed: Mar. 28, 2014

(65) Prior Publication Data

US 2015/0275358 A1 Oct. 1, 2015

(51) Int. Cl.
| | | |
|---|---|---|
| F04F 1/18 | (2006.01) | |
| C23C 16/52 | (2006.01) | |
| C23C 16/455 | (2006.01) | |
| C23C 16/448 | (2006.01) | |

(52) U.S. Cl.
CPC .......... *C23C 16/52* (2013.01); *C23C 16/4481* (2013.01); *C23C 16/45544* (2013.01); *C23C 16/45561* (2013.01); *Y10T 137/0396* (2015.04); *Y10T 137/7762* (2015.04)

(58) Field of Classification Search
CPC ........ C23C 16/45561; C23C 16/45544; C23C 16/4481; C23C 16/52; Y10T 137/0396; Y10T 137/7762; Y10T 137/0324; Y10T 137/3127; Y10T 137/6416; Y10T 137/6606; Y10T 137/7761; Y10T 137/86035; Y10T 137/86083; Y10T 137/86871

USPC .................................................. 137/208, 209
See application file for complete search history.

(56) References Cited

U.S. PATENT DOCUMENTS

| | | | | | |
|---|---|---|---|---|---|
| 4,393,013 A | * | 7/1983 | McMenamin | ........... | B01J 4/008 118/692 |
| 4,436,674 A | * | 3/1984 | McMenamin | ........... | B01J 4/008 118/692 |
| 5,091,207 A | * | 2/1992 | Tanaka | .................... | C23C 16/52 118/50 |
| 5,288,325 A | * | 2/1994 | Gomi | .................. | C23C 16/4482 118/692 |
| 5,791,369 A | * | 8/1998 | Nishino | ............... | G05D 7/0635 137/269 |
| 6,015,066 A | * | 1/2000 | Kimura | .................... | G03F 7/30 137/208 |

(Continued)

*Primary Examiner* — Craig J Price

(57) ABSTRACT

A liquid delivery system for a substrate processing system includes a liquid ampoule to store liquid precursor. A pressure adjusting system adjusts pressure in the liquid ampoule. A pressure sensor senses a pressure in the liquid ampoule. A capillary injector includes a capillary tube in fluid communication with an output of the liquid ampoule. A temperature control device controls a temperature of the capillary tube. A first valve has an input connected to the capillary tube. A controller is configured to determine a predetermined pressure in the liquid ampoule corresponding a desired flow rate and a predetermined temperature of the capillary tube, maintain the temperature of the capillary tube at the predetermined temperature, communicate with the pressure sensor and the pressure adjusting system, and control the pressure in the liquid ampoule to the predetermined pressure to provide the desired flow rate.

16 Claims, 4 Drawing Sheets

(56) References Cited

U.S. PATENT DOCUMENTS

| | | | | |
|---|---|---|---|---|
| 6,217,657 | B1* | 4/2001 | Kiba | B05D 1/005 118/319 |
| 6,267,132 | B1* | 7/2001 | Guarneri | B67D 7/02 137/14 |
| 6,277,201 | B1* | 8/2001 | Nishikawa | C23C 16/4486 118/723 VE |
| 6,663,716 | B2 | 12/2003 | Loan et al. | |
| 7,708,880 | B2* | 5/2010 | Yajima | B01D 19/0068 210/167.01 |
| 2009/0183549 | A1* | 7/2009 | Monkowski | G01F 25/0038 73/1.35 |
| 2009/0214779 | A1* | 8/2009 | Sarigiannis | C23C 16/4481 427/248.1 |
| 2009/0223451 | A1* | 9/2009 | Kruger | C23C 16/4481 118/723 VE |
| 2009/0232986 | A1* | 9/2009 | Choi | C23C 16/45561 427/255.28 |
| 2010/0012026 | A1* | 1/2010 | Hirata | C23C 16/4481 118/666 |
| 2014/0083514 | A1* | 3/2014 | Ding | G05D 7/0647 137/12 |
| 2014/0130878 | A1* | 5/2014 | Marinez | F16K 37/005 137/2 |

* cited by examiner

SYSTEMS AND METHODS FOR PRESSURE-BASED LIQUID FLOW CONTROL

FIELD

The present disclosure relates to liquid flow control, and more particularly to systems and methods for supplying liquid in substrate processing systems.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems are used to deposit and etch film on a substrate. For example for the substrate processing system may perform chemical vapor deposition (CVD), plasma-enhanced (PE) CVD, atomic layer deposition (ALD), PEALD, etc. Deposition and/or etching may be performed by supplying a gas mixture to a processing chamber. The gas mixture may include one or more gases that are mixed together. In some situations, one or more of the gases may be generated from a liquid precursor that is vaporized. Precise metering of the liquid precursor is performed to ensure that the correct gas mixture is formed in the processing chamber.

Thermal or Coriolis flow controllers are typically used to meter the liquid precursor flowing to the vaporizer. Liquid flow controllers are fully opened until a metering tube is filled. As a result, the liquid flow controllers typically overshoot a desired flow rate. In these types of systems, settling time for the flow rate can be greater than 10 seconds. Some substrate processing systems with long settling times divert the liquid or vaporized precursor until liquid flow is stabilized. Occasionally, a bubble will become trapped in the metering tube and inaccurate or no flow will persist until the liquid delivery system is serviced.

SUMMARY

A liquid delivery system for a substrate processing system includes a liquid ampoule to store liquid precursor. A pressure adjusting system adjusts pressure in the liquid ampoule. A pressure sensor senses a pressure in the liquid ampoule. A capillary injector includes a capillary tube in fluid communication with an output of the liquid ampoule. A temperature control device controls a temperature of the capillary tube. A first valve has an input connected to the capillary tube. A controller is configured to determine a predetermined pressure in the liquid ampoule corresponding a desired flow rate and a predetermined temperature of the capillary tube, maintain the temperature of the capillary tube at the predetermined temperature, communicate with the pressure sensor and the pressure adjusting system, and control the pressure in the liquid ampoule to the predetermined pressure to provide the desired flow rate.

In other features, a vaporizer has a first input in fluid communication with an output of the first valve. A liquid flow meter, in fluid communication with an output of the liquid ampoule and an input of the capillary tube, measures an actual flow rate. When the actual flow rate is not equal to the desired flow rate, the controller adjusts the pressure in the liquid ampoule using the pressure adjusting system.

In other features, when the actual flow rate is equal to the desired flow rate after the adjustment, the controller updates the predetermined pressure corresponding to the desired flow rate based on the adjustment. The pressure adjusting system comprises a vacuum source and a second valve in fluid communication with the liquid ampoule to selectively reduce the pressure in the liquid ampoule. A push gas source and a third valve in fluid communication with the liquid ampoule selectively increase the pressure in the liquid ampoule.

In other features, a first restricted orifice is arranged between the vacuum source and the second valve. A second restricted orifice is arranged between the vacuum source and the third valve. A filter is arranged between outputs of the second valve and the third valve and the liquid ampoule. The temperature control device comprises a Peltier device.

In other features, a second valve is arranged between the liquid flow meter and the capillary injector. The second valve selectively injects purge gas into the capillary tube.

In other features, an output end of the capillary tube is located less than 25.4 mm, or 1 inch, from a diaphragm of the first valve. The controller generates and stores a table including a plurality of predetermined pressures for the liquid ampoule and a corresponding plurality of desired flow rates.

A method for liquid delivery in a substrate processing system includes storing liquid precursor in a liquid ampoule; providing a capillary injector that includes a capillary tube and a first valve having an input connected to the capillary tube; determining a predetermined pressure in the liquid ampoule that corresponds to a desired flow rate and a predetermined temperature of the capillary tube; maintaining a temperature of the capillary tube at the predetermined temperature; and controlling pressure in the liquid ampoule to the predetermined pressure to achieve the desired flow rate.

In other features, the method includes vaporizing liquid received from an output of the first valve. The method includes measuring an actual flow rate at an output of the liquid ampoule using a liquid flow meter; and adjusting the pressure in the liquid ampoule when the actual flow rate is not equal to the desired flow rate.

In other features, the method includes updating the predetermined pressure corresponding to the desired flow rate based on the adjustment when the actual flow rate is equal to the desired flow rate after the adjustment.

In other features, adjusting the pressure comprises selectively opening a second valve to a vacuum source to reduce the pressure in the liquid ampoule; and selectively opening a third valve to a push gas source to increase the pressure in the liquid ampoule.

In other features, the method includes arranging a first restricted orifice between the vacuum source and the second valve; and arranging a second restricted orifice between the vacuum source and the third valve. The method includes arranging a filter between outputs of the second valve and the third valve and the liquid ampoule. The method includes adjusting the temperature of the capillary tube using a Peltier device.

In other features, the method includes arranging a second valve between the liquid flow meter and the capillary injector. The second valve selectively injects purge gas into the capillary tube. An output end of the capillary tube is located less than 25.4 mm, or 1 inch, from a diaphragm of the first valve. The method includes generating a table including a plurality of predetermined pressures for the liquid ampoule and a corresponding plurality of desired flow rates.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

The present disclosure relates to systems and methods for pressure-based liquid flow control of liquid precursor from a liquid ampoule. The liquid precursor is delivered using a capillary tube. Isothermal flow through the capillary tube is consistent for a given pressure drop. Before the systems and methods described herein deliver the liquid precursor, pressure in the liquid ampoule is set to a predetermined pressure corresponding to a predetermined flow rate. The pressure in the liquid ampoule is maintained at the predetermined pressure during delivery of the liquid precursor from the liquid ampoule.

When flow of the liquid precursor is required, a valve is opened and liquid precursor from a capillary tube flows through the valve. Liquid flow at a desired flow rate will occur quickly (e.g. within a fraction of a second) after the valve is opened. In some examples, the distance between a diaphragm of the valve and an output end of the capillary tube is relatively short to reduce the time to the desired flow rate. Both the temperature of the liquid in the capillary tube and the push pressure are maintained at controlled values to generate and maintain the desired flow rate.

A controller may be used to maintain the constant pressure in the liquid ampoule by pulsing one or more valves. Pressure under the desired set point is adjusted by increasing head pressure in the liquid ampoule by pulsing the inert push gas through a valve. Pressure over the desired set point is adjusted by reducing head pressure in the liquid ampoule by pulsing another valve to vacuum. Initial pressure requirements may be determined by slowly ramping the pressure up or down in the liquid ampoule and storing a corresponding flow rate for the pressure in memory associated with the controller.

Alternately, a digital pressure controller that maintains a pressure set point based on an analog or bus signal maybe used in place of the pulsing valves to set and control the ampoule pressure. The digital pressure controller will receive a control signal from the controller. The digital pressure controller may vent excess pressure to atmosphere, which may be suitable for non-reactive and non-toxic liquids.

When the desired flow rate changes, the controller changes the pressure to a pressure value corresponding to a new desired flow rate. The controller monitors the flow rate during liquid precursor delivery. For example only, the controller may monitor the flow rate during liquid precursor delivery using a thermal or Coriolis device. The controller compares the actual flow rate to the desired flow rate and adjusts the pressure in the liquid ampoule as needed. The adjusted pressure can be used to update or replace the pressure value stored in the memory array for the desired flow rate.

Figure 1:
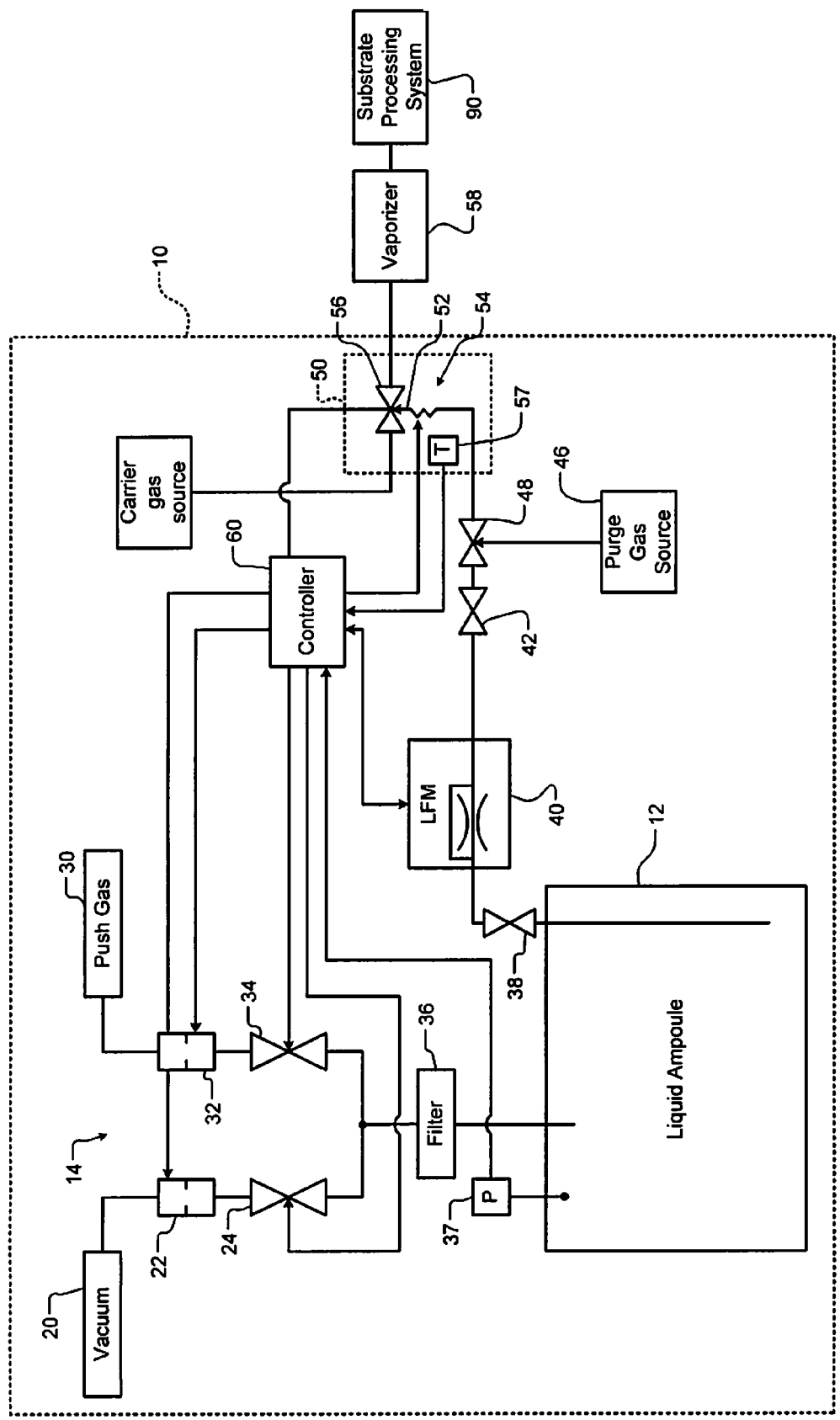
FIG. 1 is a functional block diagram of an example pressure-based liquid flow control system according to the present disclosure.

Referring now to FIG. 1, an example of a pressure-based liquid flow control system 10 is shown. The pressure-based liquid flow control system 10 includes a liquid ampoule 12 and a pressure adjusting system 14. The pressure adjusting system 14 adjusts the pressure in the liquid ampoule 12. The pressure adjusting system 14 includes a vacuum source 20 that communicates with a restricted orifice 22. An output of the restricted orifice 22 flows to a valve 24 to selectively provide vacuum pressure to the liquid ampoule 12 to reduce a pressure in the liquid ampoule 12 as needed. The pressure adjusting system 14 also includes a gas source 30 that communicates with a restricted orifice 32 and a valve 34 to selectively provide push gas to increase pressure in the liquid ampoule 12.

Outputs of the valves 24 and 34 are input to a filter 36. An output of the filter 36 is input to the liquid ampoule 12. The filter 36 acts as a snubber to reduce the impact of pressure changes as the valves 24 and 34 are modulated. A pressure sensor 37 monitors pressure in the liquid ampoule 12.

When downstream valves are open, liquid precursor flows out of the liquid ampoule 12 through a valve 38 to a liquid flow meter (LFM) 40. For example only, the LFM 40 may include a thermal or Coriolis device. An output of the liquid flow meter 40 flows through valves 42 and 48 to a capillary injector 50. One input of the valve 48 is connected to an output of the valve 42. Another input of the valve 48 may be connected to a purge gas source 46. The valve 48 may be used to selectively supply purge gas to purge liquid precursor in the capillary injector 50 as needed while the valve 42 is closed to prevent purge gas flow back to the liquid ampoule 12.

In some examples, the capillary injector 50 is temperature controlled to control a temperature of the liquid precursor. The capillary injector 50 includes a capillary tube 52, a temperature adjusting device 54, and a valve 56. One input of the valve 56 is connected to an output of the capillary tube 52. An output of the valve 56 is connected to a vaporizer 58. Another input of the valve 56 may be connected to a carrier gas source. A temperature sensor 57 may be used to monitor a temperature of the capillary tube 52 if closed loop control is desired. Open loop control may also be used. The temperature adjusting device 54 may include a resistive heater, a Peltier device or other temperature adjusting device.

A controller 60 may be used to monitor process parameters such as the pressure in the liquid ampoule 12 as measured by the pressure sensor 37 and an actual flow rate of the liquid as measured by the liquid flow meter 40. The controller 60 may also control set points for the pressure control valves 22 and 32 and opening and closing operation of the valves 24, 34, 38, 42, 48 and 56. Vaporized gas output by the vaporizer 58 is input to a substrate processing system 90. The controller 60 may also control operation of the temperature adjusting device 54.

Figure 2:
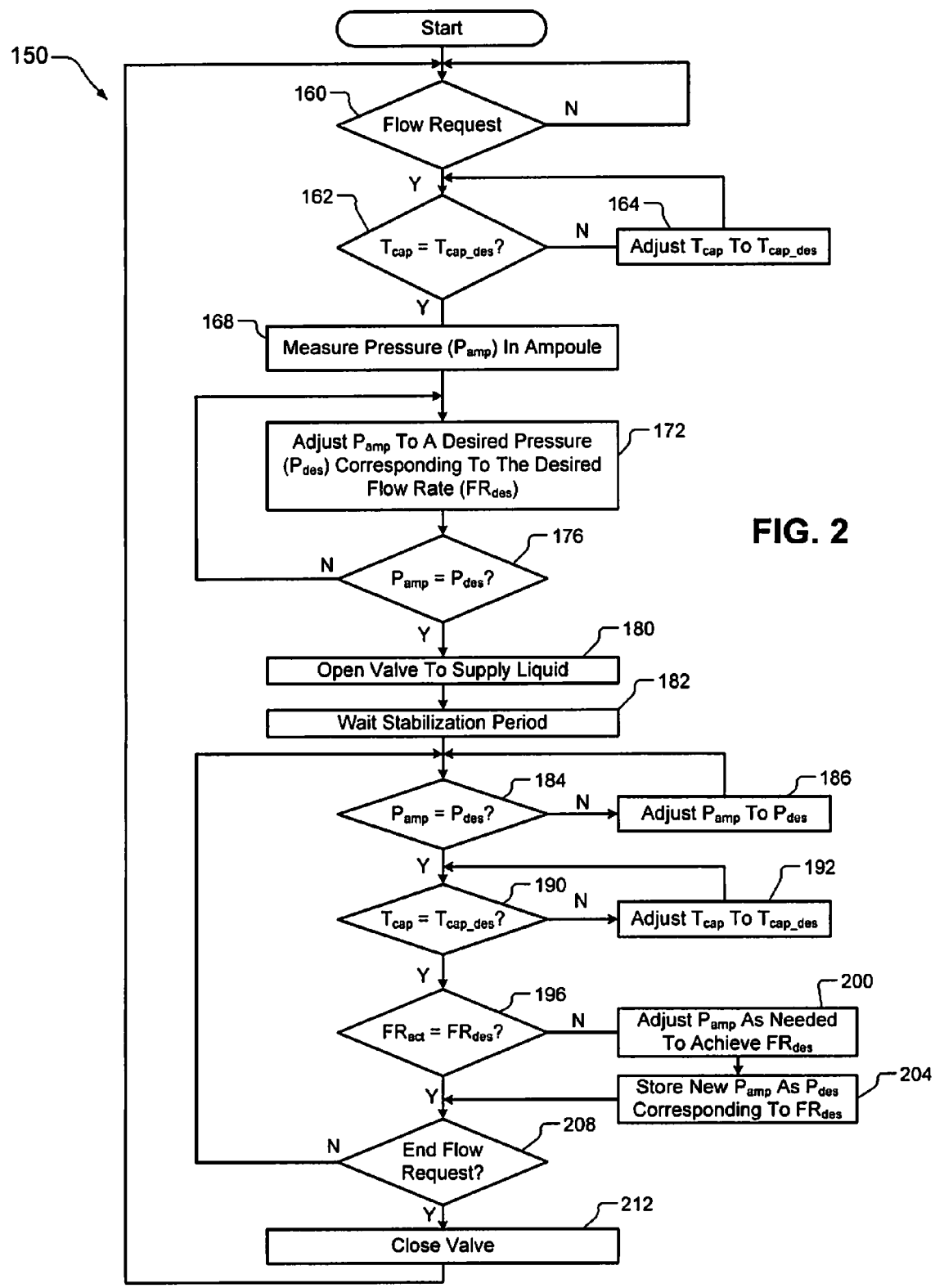
FIG. 2 illustrates an example method for operating the pressure-based liquid flow control system according to the present disclosure.

Referring now to FIG. 2, an example of a method 150 for operating the pressure-based liquid flow control system is shown. At 160, control determines whether there is a flow request for the liquid precursor. If not, control returns to 160. Otherwise, control continues at 162 and determines whether the temperature of the capillary tube $T_{cap}$ is equal to a desired temperature $T_{cap\_des}$. If not, control adjusts $T_{cap}$ to $T_{cap\_des}$. At 168, control measures pressure in the liquid ampoule. At 172, control adjusts the pressure $P_{act}$ in the liquid ampoule to a desired pressure $P_{des}$ corresponding to the desired flow rate $FR_{des}$.

At 176, control determines whether the pressure $P_{act}$ in the liquid ampoule is equal to the desired pressure $P_{des}$. If 176 is true, control continues at 180 and opens the valve to supply liquid to the vaporizer.

At 182, control optionally waits a stabilization period. At 184, control determines whether $P_{act}=P_{des}$. As can be appreciated, this condition may be met if $P_{act}$ is within a predetermined range of $P_{des}$. If not, control continues with 186 and adjusts $P_{act}$ to $P_{des}$. If 184 is true, control continues with 190 and determines whether $T_{cap}=T_{cap\_des}$. As can be appreciated, this condition may be met if $T_{cap}$ is within a predetermined range of $T_{cap\_des}$. If not, control continues with 192 and adjusts $T_{cap}$ to $T_{cap\_des}$. If 190 is true, control continues with 196 and determines whether $FR_{act}=FR_{des}$. As can be appreciated, this condition may be met if $FR_{act}$ is within a predetermined range of $FR_{des}$. If not, control continues with 200 and adjusts $P_{act}$ as needed to achieve $FR_{des}$. At 204, control stores the new $P_{act}$ as $P_{des}$ corresponding to $FR_{des}$.

At 208, control determines whether the flow request for liquid precursor has ended. If not, control continues with 184. Otherwise, control closes the valve at 212 and continues with 160.

Figure 3:
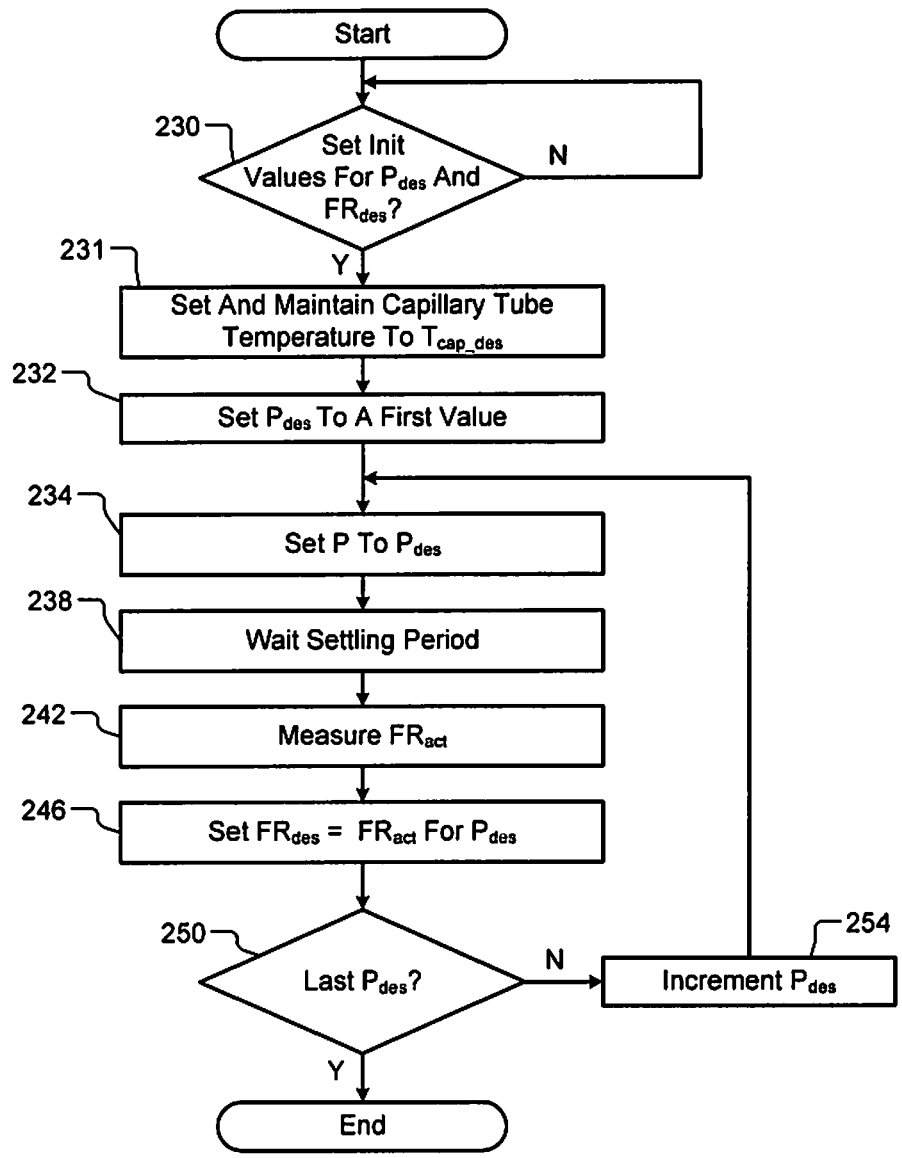
FIG. 3 illustrates an example method for generating values for desired flow rates and corresponding desired pressures.

Referring now to FIG. 3, an example of a method for determining a relationship between one or more desired flow rates and desired pressures within the liquid ampoule is shown. As can be appreciated, the capillary tube is kept at a predetermined temperature for each data set. The process can be repeated for one or more different capillary tube temperatures and the desired flow rate and desired pressure values can be stored by each of the selected capillary temperatures.

At 230, control determines whether there is a request to set initial values for the desired flow rates and desired pressures. If 230 is true, control continues with 231 and sets the capillary tube temperature to one of the desired capillary tube temperatures. At 232, a desired pressure $P_{des}$ is set to an initial value such as a lowest or highest pressure. At 234, control sets pressure in the liquid ampoule to the desired pressure $P_{des}$. At 238, control waits a settling period. At 242, control measures the actual flow rate $FR_{act}$. At 246, control sets the desired flow rate $FR_{des}$ equal to the actual flow rate $FR_{act}$ for the desired pressure $P_{des}$. At 250, control determines whether flow rates for all of the desired pressure values $P_{des}$ have been determined. If not, control continues with 254 and increments the desired pressure to the next desired pressure (or decrements if starting from the highest desired pressure $P_{des}$) and continues with 234. The process may be repeated for other capillary tube temperatures.

In some examples, a Peltier-type device is used to maintain the capillary tube at a constant temperature. The Peltier-type device typically includes first and second sides. When DC current flows through the device, heat flows from one side to the other. In other words, one side cools while the other side heats up. Either the hot side (or the cool side) is attached to a heat sink so that it remains at ambient temperature, while the cool side or the hot side goes below (or above) room temperature. In some applications, multiple Peltier-type devices can be cascaded together for lower or higher temperatures.

In some examples, the capillary tube is incorporated into the valve so that the output end of the capillary tube is just below the diaphragm of the valve. In some examples, the output end of the capillary tube is arranged within close proximity of the diaphragm of the valve. For example only, the output end of the capillary tube may be arranged within 1" of the diaphragm. The calibrated orifices may be used to achieve consistent flows to vacuum to relieve pressure and consistent flows from the inert push gas to raise pressure. The filter acts as a snubber to minimize the effects of the push gas and vacuum valves opening and closing.

The controller uses control loops to control the temperature of the capillary tube. The calibration loop varies the pressure of the liquid ampoule and records the resultant flow rate. Another control loop maintains a last pressure set point by cycling the vacuum or pressure valves on or off. Another control loop reads the actual flow rate from the LFM, compares the actual flow rate to the desired flow rate and adjusts the pressure. The pressure is stored for the corresponding flow rate and may be used to adjust or replace the pressure set point previously stored in the controller. A delay can be implemented to isolate the system from initial flow rate spikes from the LFM.

The purge gas valve provides for periodic purging of the capillary tube. Some types of liquid precursor are not stable and may clog the capillary tube if the liquid is left in the capillary tube too long.

In some examples, the valves include valves that are normally used for atomic layer deposition (ALD) processes. While the action of the ALD valve can influence repeatability since movement of a diaphragm during opening acts like a pump, a size of the capillary tube can be selected to help minimize this affect. For lower flow rates, a stroke of the ALD valve can be reduced. In some examples, a turn down ratio from maximum to minimum stable flow is around 5:1. In other examples, multiple valve/capillary tube assemblies may be used to extend the turn down ratio.

In some examples, surface tension may result in small quantities of liquid adhering to the valve. Introduction of a carrier gas can be used to move liquid out of the valve and into the vaporizer as needed.

Figure 4:
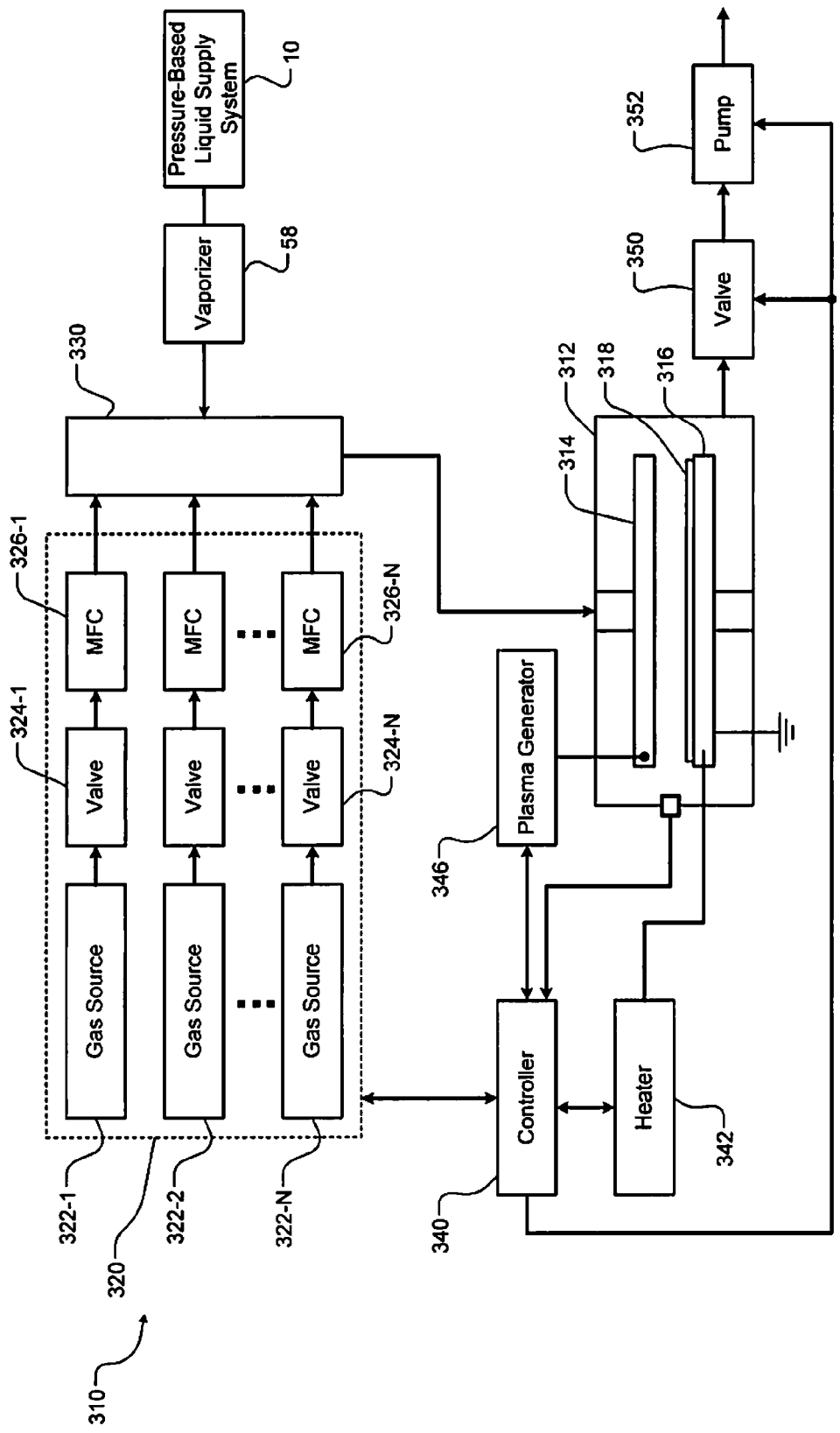
FIG. 4 is a functional block diagram of an example of a substrate processing system used in conjunction with the pressure-based liquid flow control system.

Referring now to FIG. 4, an example of a substrate processing system used in conjunction with the pressure-based liquid flow control system is shown. In some examples, the substrate processing system is used to perform atomic layer deposition (ALD), plasma-enhanced (PE) ALD, chemical vapor deposition (CVD), or PECVD.

A substrate processing system 310 is shown to include a processing chamber 312. Gas may be supplied to the processing chamber using a gas distribution device 314 such as showerhead or other device. A substrate 318 such as a semiconductor wafer may be arranged on a pedestal 316 during processing. The pedestal 316 may be an electrostatic chuck, a mechanical chuck or other type of chuck.

A gas delivery system 320 may include one or more gas sources 322-2, 322-2, . . . , and 322-N (collectively gas sources 322), where N is an integer greater than one. Valves 324-1, 324-2, . . . , and 324-N, mass flow controllers 326-1, 326-2, . . . , and 326-N, or other flow control devices may be used to controllably supply a selected gas mixture to a manifold 330, which supplies the gas mixture to the processing chamber 312. The manifold 330 also receives an output of the vaporizer 58 that vaporizes liquid supplied by the pressure-based liquid flow control system 10.

A controller 340 may be used to monitor process parameters such as temperature, pressure and process timing. The controller 340 may be implemented by the controller 60 or as a separate controller. The controller 340 may also be used to control process devices such as the gas delivery system 320, a pedestal heater 342, a plasma generator 346, and/or evacuation of the processing chamber 312. In some examples, a valve 350 and pump 352 may be used to remove reactants from the processing chamber 312. The RF plasma generator 346 may generate the RF plasma in the processing chamber. The RF plasma generator 346 may be an inductive or capacitive-type RF plasma generator. The RF plasma generator 346 may include a high frequency RF generator, a low frequency RF generator and a matching network (not shown).

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. As used herein, the phrase at least one of A, B, and C should be construed to mean a logical (A or B or C), using a non-exclusive logical OR. It should be understood that one or more steps within a method may be executed in different order (or concurrently) without altering the principles of the present disclosure.

In this application, including the definitions below, the term controller may be replaced with the term circuit. The term controller may refer to, be part of, or include an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor (shared, dedicated, or group) that executes code; memory (shared, dedicated, or group) that stores code executed by a processor; other suitable hardware components that provide the described functionality; or a combination of some or all of the above, such as in a system-on-chip.

The term code, as used above, may include software, firmware, and/or microcode, and may refer to programs, routines, functions, classes, and/or objects. The term shared processor encompasses a single processor that executes some or all code from multiple controllers. The term group processor encompasses a processor that, in combination with additional processors, executes some or all code from one or more controllers. The term shared memory encompasses a single memory that stores some or all code from multiple controllers. The term group memory encompasses a memory that, in combination with additional memories, stores some or all code from one or more controllers. The term memory may be a subset of the term computer-readable medium. The term computer-readable medium does not encompass transitory electrical and electromagnetic signals propagating through a medium, and may therefore be considered tangible and non-transitory. Non-limiting examples of a non-transitory tangible computer readable medium include nonvolatile memory, volatile memory, magnetic storage, and optical storage.

The apparatuses and methods described in this application may be partially or fully implemented by one or more computer programs executed by one or more processors. The computer programs include processor-executable instructions that are stored on at least one non-transitory tangible computer readable medium. The computer programs may also include and/or rely on stored data.

What is claimed is:

1. A liquid delivery system for a substrate processing system, comprising:
    a liquid ampoule to store liquid precursor;
    a pressure adjusting system to adjust pressure in the liquid ampoule;
    a pressure sensor to sense a pressure in the liquid ampoule;
    a capillary injector comprising:
        a capillary tube in fluid communication with an output of the liquid ampoule;
        a temperature control device to control a temperature of the capillary tube; and
        a first valve having an input connected to the capillary tube; and
    a controller that:
        for a desired flow rate in the liquid ampoule, determines a relationship between a desired pressure in the liquid ampoule and the desired flow rate at a predetermined temperature of the capillary tube,
        maintains a temperature of the capillary tube at the predetermined temperature,
        communicates with the pressure sensor and the pressure adjusting system, and
        controls a pressure in the liquid ampoule to the desired pressure to provide the desired flow rate; and
    a liquid flow meter in fluid communication with an output of the liquid ampoule and an input of the capillary tube to measure an actual flow rate,
        wherein when the actual flow rate is not equal to the desired flow rate, the controller adjusts the pressure in the liquid ampoule using the pressure adjusting system, and
        wherein when the actual flow rate is equal to the desired flow rate after the adjusting of the pressure in the liquid ampoule, the controller updates the desired pressure corresponding to the desired flow rate based on the adjusting.

2. The liquid delivery system of claim 1, further comprising a vaporizer having a first input in fluid communication with an output of the first valve.

3. The liquid delivery system of claim 1, wherein the pressure adjusting system comprises:
    a vacuum source and a second valve in fluid communication with the liquid ampoule to selectively reduce the pressure in the liquid ampoule; and
    a push gas source and a third valve in fluid communication with the liquid ampoule to selectively increase the pressure in the liquid ampoule.

4. The liquid delivery system of claim 3, further comprising:
    a first restricted orifice arranged between the vacuum source and the second valve; and
    a second restricted orifice arranged between the vacuum source and the third valve.

5. The liquid delivery system of claim 3, further comprising a filter arranged between outputs of the second valve and the third valve and the liquid ampoule.

6. The liquid delivery system of claim 1, wherein the temperature control device comprises a Peltier device.

7. The liquid delivery system of claim 1, further comprising a second valve arranged between the liquid flow meter and the capillary injector, wherein the second valve selectively injects purge gas into the capillary tube.

8. The liquid delivery system of claim 1, wherein the controller generates and stores a table including a plurality of desired pressures for the liquid ampoule and a corresponding plurality of desired flow rates.

9. A method for liquid delivery in a substrate processing system, comprising:
   storing liquid precursor in a liquid ampoule;
   providing a capillary injector that includes a capillary tube and a first valve having an input connected to the capillary tube;
   for a desired flow rate in the liquid ampoule, determining a relationship between a desired pressure in the liquid ampoule and the desired flow rate at a predetermined temperature of the capillary tube;
   maintaining a temperature of the capillary tube at the predetermined temperature; and
   controlling a pressure in the liquid ampoule to the desired pressure to achieve the desired flow rate;
   measuring an actual flow rate at an output of the liquid ampoule using a liquid flow meter;
   adjusting the pressure in the liquid ampoule when the actual flow rate is not equal to the desired flow rate; and
   updating the desired pressure corresponding to the desired flow rate based on the adjusting of the pressure in the liquid ampoule when the actual flow rate is equal to the desired flow rate after the adjusting.

10. The method of claim 9, further comprising:
    vaporizing liquid received from an output of the first valve.

11. The method of claim 9, wherein adjusting the pressure comprises:
    selectively opening a second valve to a vacuum source to reduce the pressure in the liquid ampoule; and
    selectively opening a third valve to a push gas source to increase the pressure in the liquid ampoule.

12. The method of claim 11, further comprising:
    arranging a first restricted orifice between the vacuum source and the second valve; and
    arranging a second restricted orifice between the vacuum source and the third valve.

13. The method of claim 11, further comprising arranging a filter arranged between outputs of the second valve and the third valve and the liquid ampoule.

14. The method of claim 9, further comprising adjusting the temperature of the capillary tube using a Peltier device.

15. The method of claim 9, further comprising arranging a second valve between the liquid flow meter and the capillary injector, wherein the second valve selectively injects purge gas into the capillary tube.

16. The method of claim 9, further comprising generating a table including a plurality of desired pressures for the liquid ampoule and a corresponding plurality of desired flow rates.

* * * * *